US010957395B2

(12) United States Patent
Shin et al.

(10) Patent No.: US 10,957,395 B2
(45) Date of Patent: Mar. 23, 2021

(54) NONVOLATILE MEMORY DEVICES AND OPERATING METHODS THEREOF

(71) Applicant: Samsung Electronics Co., Ltd., Suwon-si (KR)

(72) Inventors: Hoyoung Shin, Gunpo-si (KR); Ji-Sung Kim, Seoul (KR); Hyun-Jin Shin, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/828,099

(22) Filed: Mar. 24, 2020

(65) Prior Publication Data
US 2021/0005261 A1    Jan. 7, 2021

(30) Foreign Application Priority Data

Jul. 1, 2019  (KR) ........................ 10-2019-0078913

(51) Int. Cl.
*G11C 16/10* (2006.01)
*G11C 16/04* (2006.01)
*G11C 16/30* (2006.01)
*G11C 16/24* (2006.01)
*G11C 16/08* (2006.01)

(52) U.S. Cl.
CPC .......... *G11C 16/10* (2013.01); *G11C 16/0408* (2013.01); *G11C 16/08* (2013.01); *G11C 16/24* (2013.01); *G11C 16/30* (2013.01)

(58) Field of Classification Search
CPC ..... G11C 16/10; G11C 16/0408; G11C 16/08; G11C 16/24; G11C 16/30
See application file for complete search history.

(56) References Cited

U.S. PATENT DOCUMENTS

| 6,388,921 | B1 | 5/2002 | Yamamoto et al. |
| 6,927,999 | B2 | 8/2005 | Sim et al. |
| 7,310,280 | B2 | 12/2007 | Park et al. |
| 7,417,895 | B2 | 8/2008 | Cho |
| 7,489,557 | B2 | 2/2009 | Kim et al. |
| 7,898,889 | B2 | 3/2011 | Hashimoto et al. |
| 8,274,841 | B2 | 9/2012 | Shimano et al. |
| 8,379,456 | B2 | 2/2013 | Park et al. |
| 2009/0116318 | A1* | 5/2009 | Kuroda ............... G11C 11/4099 365/200 |

(Continued)

FOREIGN PATENT DOCUMENTS

JP      3283955 B2    5/2002
KR   10-2008-0085409 A    9/2008

*Primary Examiner* — Han Yang
(74) *Attorney, Agent, or Firm* — Myers Bigel, P.A.

(57) ABSTRACT

A nonvolatile memory device includes a memory cell array including a main memory area and a dummy memory area, a row decoder, a bit line selection circuit, a data input/output circuit, a control circuit, and a voltage generator. The bit line selection circuit is configured to select a first main bit line during a program time and is configured to select a dummy bit line during a column address switch time. During the column address switch time, a second main bit line is selected. The voltage generator is configured to output, to the row decoder, a source line voltage to be applied to a selected source line during the program time and during the column address switch time, wherein the source line voltage is maintained at a voltage level during the program time and during the column address switch time.

20 Claims, 10 Drawing Sheets

(56) References Cited

U.S. PATENT DOCUMENTS

2010/0097866 A1* 4/2010 Kobayashi ............... G11C 7/14
                                                        365/189.07
2012/0195109 A1* 8/2012 Noro .................... G11C 11/419
                                                        365/154

* cited by examiner

NONVOLATILE MEMORY DEVICES AND OPERATING METHODS THEREOF

CROSS-REFERENCE TO RELATED APPLICATION

This application claims priority under 35 U.S.C. § 119 to Korean Patent Application No. 10-2019-0078913 filed on Jul. 1, 2019, in the Korean Intellectual Property Office, the disclosure of which is incorporated by reference herein in its entirety.

TECHNICAL FIELD

Aspects of the present disclosure relate to semiconductor memory devices, and more particularly, relate to nonvolatile memory devices and program and/or operating methods thereof.

BACKGROUND

A semiconductor memory device is a storage device that is implemented by using semiconductor such as silicon. A semiconductor memory device may be classified as a volatile memory device, examples of which include a dynamic random access memory (DRAM) or a static RAM (SRAM), or may be classified as a nonvolatile memory device, examples of which include an electrically erasable and programmable ROM (EEPROM), a flash memory device, a phase-change RAM (PRAM), or a ferroelectric RAM (FRAM).

A nonvolatile memory device may retain data stored therein when electrical operating power to the nonvolatile memory device is turned off or disabled. Among the nonvolatile memory devices, the flash memory device has advantages such as a high program speed, low power consumption, and storing a large amount of data. Flash memory devices that store bit information through injecting charges into floating gates formed of polysilicon are being used to implement various storage media. Such flash memory devices may be referred to as floating gate-type flash memory devices. There is an increasing demand for reducing program error while increasing a program speed of floating gate-type flash memory devices.

SUMMARY

Aspects of the present disclosure provide nonvolatile memory devices and operating methods thereof that may improve a speed at which a program operation is performed and reduces a program error due to an operation for improving the speed.

According to some embodiments, a nonvolatile memory device includes a memory cell array, a row decoder, a bit line selection circuit, a data input/output circuit, a control circuit, and a voltage generator. The memory cell array includes a main memory area connected to a plurality of main bit lines, and the memory cell array also includes a dummy memory area connected to a dummy bit line. The row decoder is connected to the memory cell array through a plurality of word lines and a plurality of source lines. The bit line selection circuit is configured to select at least one main bit line of the plurality of main bit lines during a program time and is configured to select the dummy bit line during a column address switch time that occurs after the program time. The data input/output circuit is connected to the bit line selection circuit through a plurality of data lines. The control circuit is configured to control the row decoder and the bit line selection circuit based on an address and a command. The voltage generator is configured to output, to the row decoder, a source line voltage to be applied to a source line selected from the plurality of source lines during the program time and during the column address switch time. A voltage level of the source line voltage during the program time equals a voltage level of the source line voltage during the column address switch time.

According to some embodiments, a nonvolatile memory device includes memory cell array, a row decoder, a bit line selection circuit, a data input/output circuit, and a voltage generator. The memory cell array includes a plurality of main memory areas and a plurality of dummy memory areas alternately arranged in a direction in which a plurality of word lines and a plurality of source lines extend. The row decoder is connected to the memory cell array through the plurality of word lines and the plurality of source lines. The bit line selection circuit includes a plurality of main selection circuits, each connected to a respective main memory area through main bit lines, and the bit line selection circuit includes a plurality of dummy selection circuits, each connected to a respective dummy memory area through a dummy bit line. The data input/output circuit is configured to pass a current transferred from the main selection circuits based on a first value of input data and is configured to pass a current transferred from the dummy selection circuits based on a second value of the input data. The voltage generator is configured to maintains an output of a word line voltage and a source line voltage at a voltage level while a program operation is performed on a word line selected from the plurality of word lines.

According to some embodiments, an method of operating a nonvolatile memory device may include outputting a word line voltage and a source line voltage to a row decoder, applying the word line voltage and the source line voltage to a selected word line and a selected source line, respectively, selecting a first bit line based on a first address, performing a program operation on a main memory cell connected to the selected word line, the selected source line, and the first bit line, selecting a dummy bit line during a column address switch time in which a second bit line is selected based on a second address, and sinking a current generated based on the source line voltage through the dummy bit line during the column address switch time.

BRIEF DESCRIPTION OF THE FIGURES

The above and other objects and features of the inventive concepts will become apparent by describing in detail examples of embodiments thereof with reference to the accompanying drawings.

DETAILED DESCRIPTION

Below, examples of embodiments of the inventive concepts will be described clearly and in detail with reference to accompanying drawings to such an extent so as to permit one of ordinary skill in the art to implement the inventive concepts in various embodiments, including embodiments not explicitly discussed herein.

Figure 1:
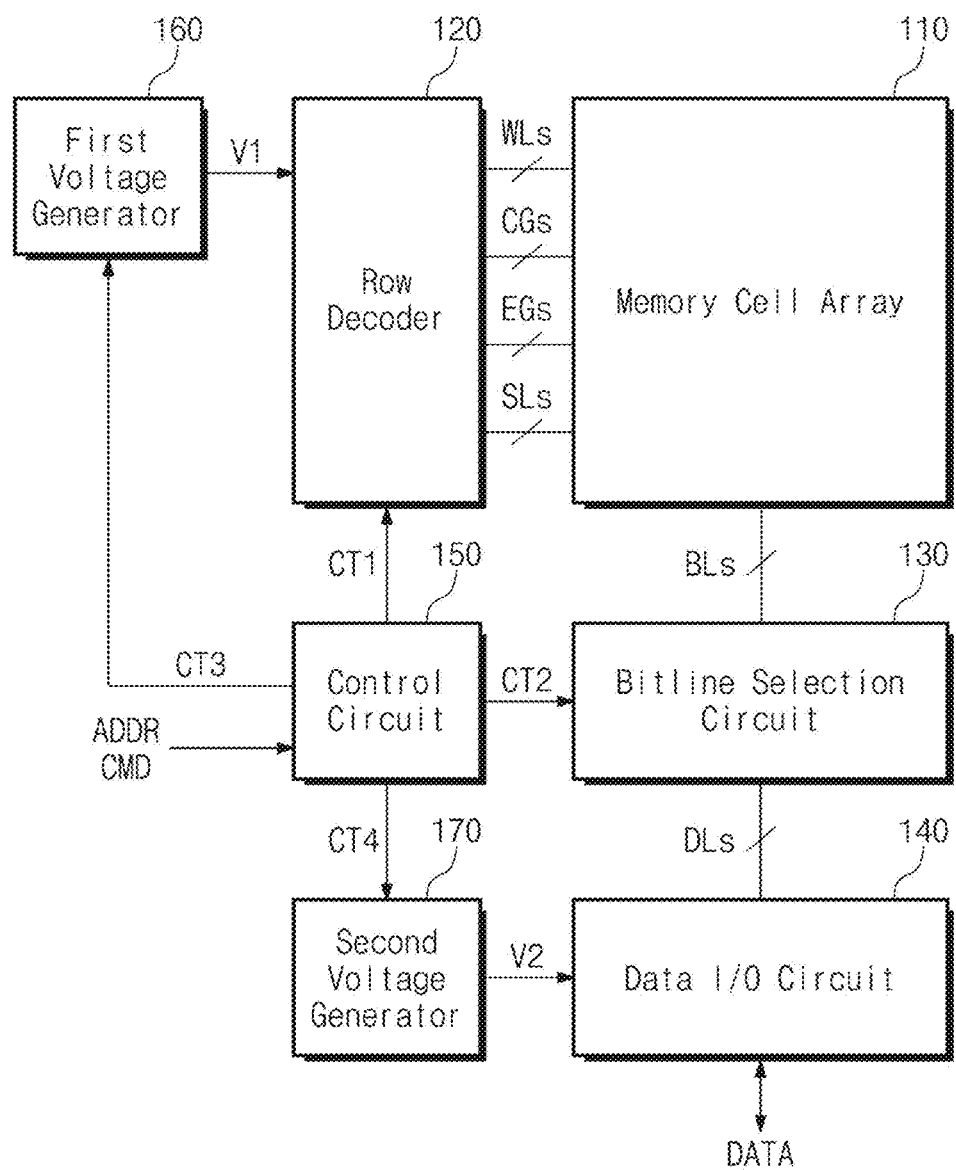
FIG. 1 is a block diagram of a nonvolatile memory device according to some embodiments of the inventive concepts.

FIG. 1 is a block diagram of a nonvolatile memory device according to some embodiments of the inventive concepts. Referring to FIG. 1, a nonvolatile memory device 100 may include a memory cell array 110, a row decoder 120, a bit line selection circuit 130, a data input/output (I/O) circuit 140, a control circuit 150, a first voltage generator 160, and a second voltage generator 170. The nonvolatile memory device 100 may be a flash memory device and may be, for example, a NOR flash memory device.

The memory cell array 110 may be connected to the row decoder 120 through word lines WL, coupling gate lines CG, erase gate lines EG, and source lines SL. The memory cell array 110 may be connected to the bit line selection circuit 130 through bit lines BL. The memory cell array 110 may include a plurality of memory cells. Memory cells within the memory cell array 110 may be arranged in rows and columns, and may share word lines WL, coupling gate lines CG, erase gate lines EG, and source lines SL based on the arrangement. For example, memory cells arranged in a row direction may share one word line, a coupling gate line, an erase gate line, and a source line. Memory cells arranged in a column direction may share one bit line. Each of the memory cells may be configured to store one or more bits. The memory cell array 110 will be described in greater detail herein.

The row decoder 120 may be configured to receive a first voltage V1 from the first voltage generator 160. The first voltage V1 may include a word line voltage, a coupling gate voltage, an erase gate voltage, and a source line voltage. The row decoder 120 may select a word line, a coupling gate line, an erase gate line, and a source line based on an address ADDR and a command CMD.

The row decoder 120 may select a word line in a program operation or a read operation. The row decoder 120 may provide the word line voltage (e.g., a program voltage, a word line program voltage) for the program operation to the selected word line. The row decoder 120 may provide the word line voltage (e.g., a read voltage, a word line read voltage) for the read operation to the selected word line. In some embodiments, a level of the word line read voltage and a level of the word line program voltage may differ.

The row decoder 120 may select a source line in the program operation. The row decoder 120 may provide a selection source line voltage for the program operation to the selected source line. The row decoder 120 may provide a non-selection source line voltage to unselected source line (s). In some embodiments, a level of the selection source line voltage and a level of the non-selection source line voltage may differ.

The row decoder 120 may select a coupling gate line in the program operation or the read operation. The row decoder 120 may provide the coupling gate voltage for the program operation to the selected coupling gate line. In some embodiments, the coupling gate voltage may be greater than the selection source line voltage. The row decoder 120 may provide the coupling gate voltage for the read operation to the selected coupling gate. In some embodiments, the coupling gate voltage may be the same as the read voltage to be provided to the selected word line.

The row decoder 120 may provide an erase gate voltage for an erase operation to erase gate lines EG in the erase operation. The row decoder 120 may select an erase gate line in the program operation. The row decoder 120 may provide a voltage for the program operation to the selected erase gate line, and the voltage may be, for example, the same as the selection source line voltage.

The bit line selection circuit 130 may select a bit line in the program operation or the read operation. During the program operation, a program current may flow to a bit line selected by the bit line selection circuit 130. During the program operation, a suppression voltage may be applied to a bit line that is not selected by the bit line selection circuit 130 (in other words, an unselected bit line). As such, a memory cell connected to the unselected bit line may not be programmed. During the read operation, a read current may flow to a bit line selected by the bit line selection circuit 130.

The data input/output circuit 140 may be connected to the bit line selection circuit 130 through data lines DL. The data input/output circuit 140 may receive program data from a data source outside of the nonvolatile memory device 100 during the program operation. For example, the data input/output circuit 140 may receive data "DATA" from a memory controller (not illustrated). The data input/output circuit 140 may provide the data "DATA" to a data destination outside of the nonvolatile memory device 100, for example, the memory controller (not illustrated) during the read operation. In some embodiments, the data source and the data destination may be the same.

The control circuit 150 may be configured to control overall operations of the nonvolatile memory device 100. The control circuit 150 may be configured to control the program operation, the read operation, or the erase operation of the nonvolatile memory device 100 by using the command CMD and the address ADDR provided from the memory controller (not illustrated).

The control circuit 150 may generate a first control signal CT1 that is used to allow the row decoder 120 to select a word line, a coupling gate line, an erase gate line, and a source line. The control circuit 150 may generate a second control signal CT2 that is used to allow the bit line selection circuit 130 to select a bit line. The control circuit 150 may generate a third control signal CT3 that is used to allow the first voltage generator 160 to generate the first voltage V1. The control circuit 150 may generate a fourth control signal CT4 that is used to allow the second voltage generator 170 to generate a second voltage V2 corresponding to a bias voltage to be provided in the program operation. The control circuit 150 may further generate a control signal (not illustrated in FIG. 1) for controlling an input/output of the data "DATA" and may output the control signal to the data input/output circuit 140.

The first voltage generator 160 may generate the first voltage V1 to be provided to the row decoder 120. The first voltage generator 160 may generate the first voltage V1 having various voltage levels. For example, the first voltage generator 160 may generate a word line voltage, a coupling gate voltage, an erase gate voltage, and a source line voltage and may output the generated voltages in parallel.

In some embodiments, the first voltage generator 160 may include a voltage generator that generates the word line voltage to be provided to a selected word line in the program operation. For example, the first voltage generator 160 may further include a voltage generator that generates the coupling gate voltage to be provided to a selected coupling gate in the program operation. Because the coupling gate voltage is required to be higher in voltage level than a supply voltage (e.g., a VDD voltage) in the program operation, the first voltage generator 160 may pump (e.g., boost) the supply voltage to generate the coupling gate voltage.

In some embodiments, the first voltage generator 160 may further include a voltage generator that generates a voltage (hereinafter referred to as a "source line voltage") to be provided to a selected source line or erase gate line in the program operation. Because the source line voltage is required to be lower in voltage level than the coupling gate voltage and higher in voltage level than the supply voltage (e.g., a VDD voltage) in the program operation, the first voltage generator 160 may pump (e.g., boost) the supply voltage to generate the source line voltage.

During the program operation, when a word line, a coupling gate line, an erase gate line, and a source line may be selected by the row decoder 120. The first voltage generator 160 may output the first voltage V1 until all the memory cells corresponding to a selected row are completely programmed. While the memory cells corresponding to the selected row are programmed, the bit line selection circuit 130 may continue to change bit lines BL targeted for the program operation based on column addresses. The first voltage generator 160 may continue outputting (e.g., may not stop outputting) the first voltage V1 even while bit lines targeted for the program operation are changed. That is, the first voltage generator 160 may maintain the output of the first voltage V1 until the memory cells corresponding to the selected row are completely programmed. As such, a time needed to block (or discharge) and output (or charge) the first voltage V1 may be reduced.

During a time (hereinafter referred to as a "column address switch time") when bit lines targeted for the program operation are changed, a current that is generated in the memory cell array 110 may not flow to the bit line selection circuit 130. For example, during the program operation, a current may flow based on a potential difference between a selected source line and a selected bit line. However, during the column address switch time, a current may not flow to a bit line, for example because a path to the selected bit line is blocked. Thus, a level of the source line voltage may sharply increase. In this case, unselected memory cells may be programmed. Accordingly, to prevent the program error, the memory cell array 110 may include a separate dummy memory area. The dummy memory area will be described in greater detail herein.

The second voltage generator 170 may generate the second voltage V2 to be provided to the data input/output circuit 140 in the program operation. The second voltage V2 may include a bias voltage that turns on a transistor of the data input/output circuit 140 such that a program current flows during the program operation.

Figure 2:
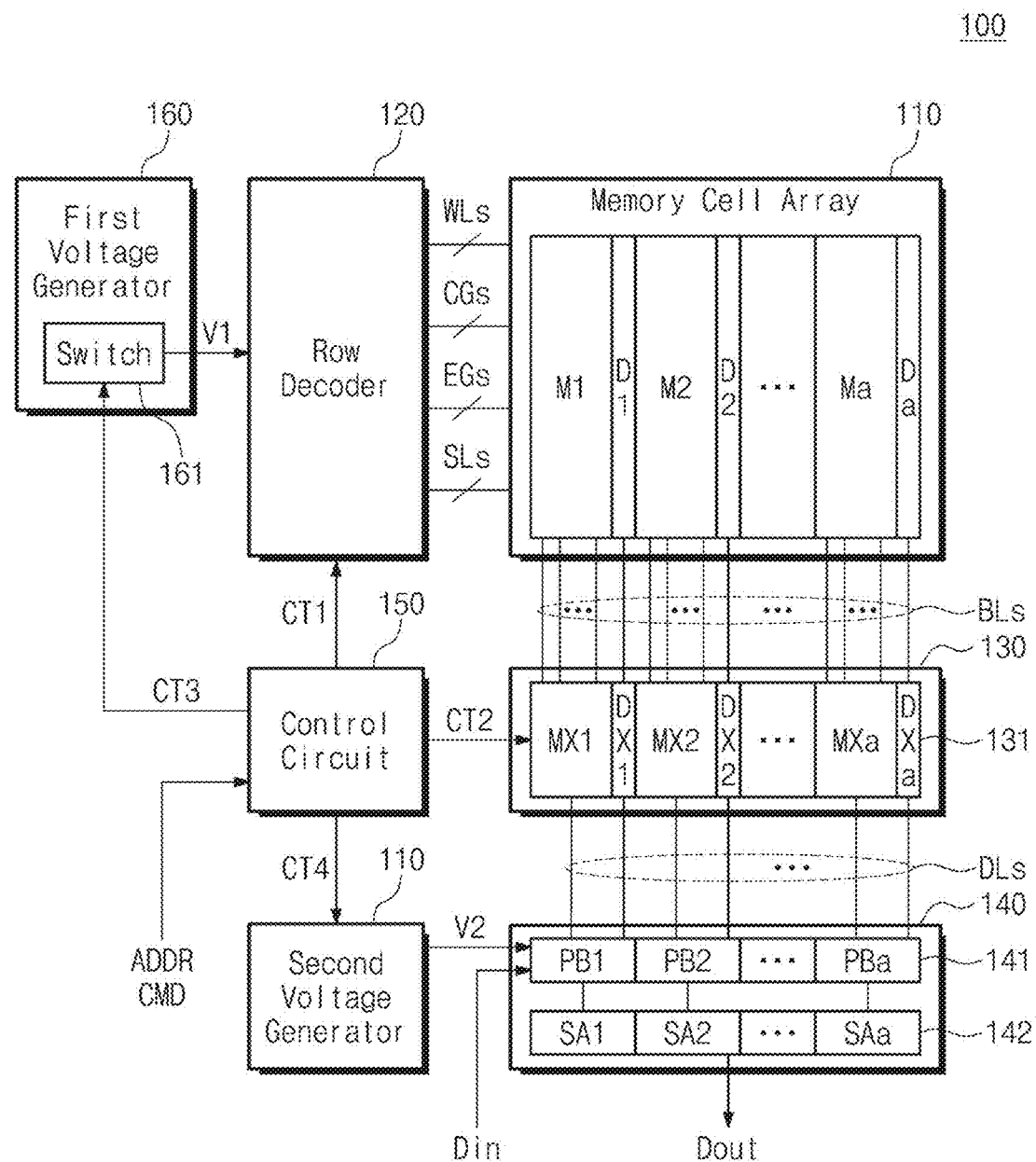
FIG. 2 is a block diagram illustrating a nonvolatile memory device of FIG. 1 in detail.

FIG. 2 is a block diagram illustrating a nonvolatile memory device of FIG. 1 in greater detail. Referring to FIG. 2, the nonvolatile memory device 100 includes the memory cell array 110, the row decoder 120, the bit line selection circuit 130, the data input/output circuit 140, the control circuit 150, the first voltage generator 160, and the second voltage generator 170, which correspond to components having the same reference numerals of FIG. 1, respectively. Thus, some description provided with respect to FIG. 1 will be omitted in the description of FIG. 2 to avoid redundancy.

The memory cell array 110 may include a plurality of main memory areas M1 to Ma and a plurality of dummy memory areas D1 to Da. The plurality of main memory areas M1 to Ma and the plurality of dummy memory areas D1 to Da may be alternately arranged in a row direction (e.g., a direction in which word lines WL extend). As an example, a first main memory area M1, a first dummy memory area D1, a second main memory area M2, and a second dummy memory area D2 may be arranged in order in the row direction.

During the program operation, input data Din may be programmed in the plurality of main memory areas M1 to Ma. In some embodiments, as illustrated in the example of FIG. 2, a number of main memory areas M1 to Ma may be "a". Each of the plurality of main memory areas M1 to Ma may be connected with bit lines, the number of which is determined in advance (e.g., "b"). In the case where one memory cell stores one bit, the input data Din of "a" bits that are input in parallel may be programmed in memory cells (or main memory cells) corresponding to one word line as much as "b" times. A time taken to program main memory cells connected to a selected word line may be defined as a word program time. For example, during the word program time, the input data Din of "a×b" bits may be programmed.

As described with reference to FIG. 1, a column address switch time may be required within the word program time for the purpose of changing selected bit lines. During the column address switch time, bit lines (or main bit lines) connected with the plurality of main memory areas M1 to Ma are not selected. In other words, none of the main bit lines are selected during the column address switch time. A source line voltage may be applied to a selected source line even during the column address switch time for a higher-speed program operation, but a current flowing from a source line to a bit line may sharply decrease at the arrival of the column address switch time. This reason is that current paths formed through main bit lines may be blocked during the column address switch time. As such, the source line voltage may sharply increase, and a program error of the memory cell array 110 may occur.

The plurality of dummy memory areas D1 to Da may make it possible to suppress a sharp increase of a source line voltage occurring during the column address switch time. During the column address switch time, bit lines (or dummy bit lines) connected to the plurality of dummy memory areas D1 to Da may be selected. As such, during the column address switch time, a current path from the memory cell array 110 to the bit line selection circuit 130 may be formed through the dummy bit lines. During the column address switch time, a current may flow through the dummy bit lines, and the source line voltage may be stably maintained.

Each of the plurality of dummy memory areas D1 to Da may be arranged adjacent to at least one of the plurality of main memory areas M1 to Ma. For example, the first dummy memory area D1 may be arranged adjacent to the first main memory area M1, and the second dummy memory area D2 may be adjacent to the second main memory area M2.

Adjacent memory areas have similar characteristics. For example, an impedance that is determined by a line resistance of source lines SL may exist, and a load of memory areas due to this impedance similarly appears in adjacent memory areas.

The plurality of dummy memory areas D1 to Da may form current paths to be adjacent to the plurality of main memory areas M1 to Ma during the column address switch time. During the program time, at least one main bit line corresponding to each of the plurality of main memory areas M1 to Ma is selected. A change of a source line voltage that occurs when the selected main bit lines are in a non-selection state during the column address switch time may be suppressed by the current paths formed by the plurality of dummy memory areas D1 to Da. For example, the change of the source line voltage that is caused when a bit line targeted for the program operation is changed with regard to the first main memory area M1 may be suppressed by the first dummy memory area D1. The change of the source line voltage that is caused when a bit line targeted for the program operation is changed with regard to the second main memory area M2 may be suppressed by the second dummy memory area D2.

The bit line selection circuit 130 may include a multiplexer circuit 131 for electrically connecting bit lines selected from the plurality of bit lines BL with the plurality of data lines DL. The bit line selection circuit 130 may include a plurality of main selection circuits MX1 to MXa respectively corresponding to the plurality of main memory areas M1 to Ma, and the bit line selection circuit 130 may include a plurality of dummy selection circuits DX1 to DXa respectively corresponding to the plurality of dummy memory areas D1 to Da. Each of the selection circuits MX1 to MXa and DX1 to DXa may be implemented with a multiplexer.

The plurality of main selection circuits MX1 to MXa may be connected with the plurality of main memory areas M1 to Ma through main bit lines. During the program time, each of the plurality of main selection circuits MX1 to MXa selects at least one of the main bit lines. During the column address switch time, each of the plurality of main selection circuits MX1 to MXa does not select a main bit line until the input data Din and the address ADDR for selecting a next main bit line are completely set up.

The plurality of dummy selection circuits DX1 to DXa are connected with the plurality of dummy memory areas D1 to Da through dummy bit lines. During the column address switch time, each of the plurality of dummy selection circuits DX1 to DXa selects a dummy bit line, and thus, a current path is formed. This may mean that a stable current sink may be possible even during the column address switch time.

Operations of the plurality of dummy selection circuits DX1 to DXa do not depend on the address ADDR. For example, the plurality of dummy selection circuits DX1 to DXa may select the dummy bit lines when the second control signal CT2 (e.g., a column address) corresponding to the address ADDR is not received. For example, the plurality of dummy selection circuits DX1 to DXa may operate based on the input data Din regardless of the address ADDR. During the column address switch time, the input data Din having a certain value (e.g., a value of "0" or a value of "1") may be provided to the nonvolatile memory device 100, and the plurality of dummy selection circuits DX1 to DXa may select the dummy bit lines when the certain value is input.

The data input/output circuit 140 includes a program buffer circuit 141 and a sense amplifier circuit 142. The program buffer circuit 141 may receive the input data Din from the data source outside during the program operation. The sense amplifier circuit 142 may transmit output data Dout to the data destination in the read operation.

The program buffer circuit 141 receives the input data Din in the program operation. A program current corresponding to the input data Din may flow to the program buffer circuit 141 based on the second voltage V2. This program current corresponds to a current flowing to a selected bit line. The program buffer circuit 141 may include a plurality of program buffers PB1 to PBa respectively corresponding to the plurality of main selection circuits MX1 to MXa (or the plurality of dummy selection circuits DX1 to DXa).

The plurality of program buffers PB1 to PBa may be connected with the plurality of main selection circuits MX1 to MXa or the plurality of dummy selection circuits DX1 to DXa through the data lines DL. Currents flowing through selected bit lines may be provided to the plurality of program buffers PB1 to PBa. The input data Din may be programmed in the memory cell array 110 in parallel corresponding to the number of program buffers PB1 to PBa.

The sense amplifier circuit 142 senses a current (or a read current) flowing through a selected bit line in the read operation. The sense amplifier circuit 142 may generate the output data Dout based on the sensed read current. The sense amplifier circuit 142 may include a plurality of sense amplifiers SA1 to SAa respectively corresponding to the plurality of main selection circuits MX1 to MXa. Memory cells may be read in parallel corresponding to the number of sense amplifiers SA1 to SAa.

The first voltage generator 160 may include a switch 161 for outputting the first voltage V1 during the word program time. The switch 161 may be turned on during the word program time and may output the first voltage V1 including a word line voltage, a coupling gate voltage, an erase gate voltage, and a source line voltage to the row decoder 120. The switch 161 may be continuously turned on during the column address switch time included in the word program time. The switch 161 may be turned off when the program operation for the selected word line is completed. For example, the switch 161 may be turned off during a row address switch time for changing a word line or a source line targeted for the program operation.

Figure 3:
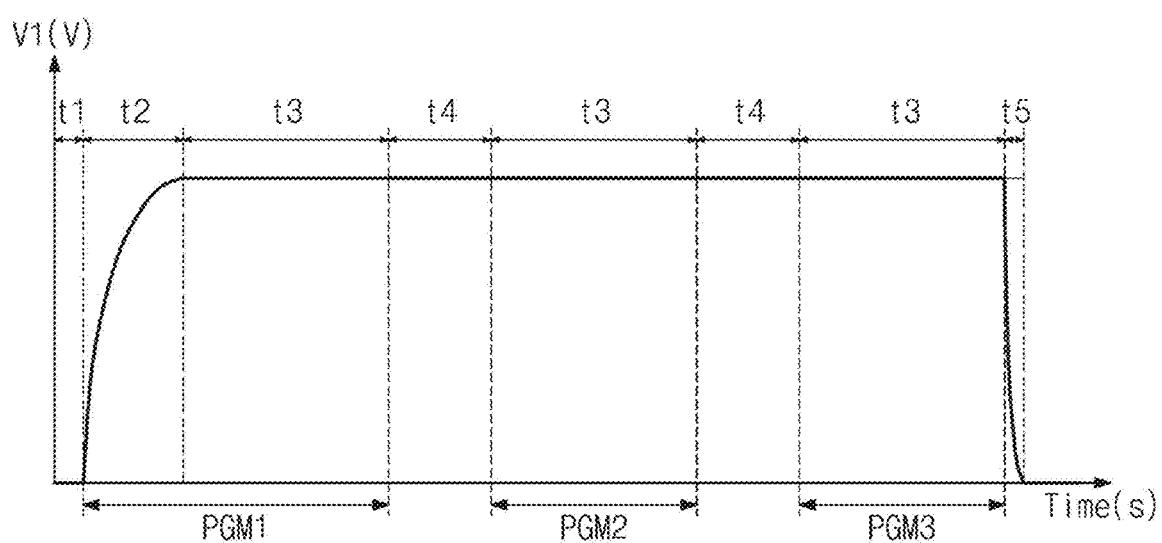
FIG. 3 is a graph illustrating a first voltage that a first voltage generator of FIGS. 1 and 2 outputs.

FIG. 3 is a graph illustrating a first voltage outputted by the first voltage generator 160 of FIGS. 1 and 2. FIG. 3 illustrates a level of the first voltage V1 corresponding to the above-described word program time. Referring to FIG. 3, the horizontal axis represents time, and the vertical axis represents a voltage level of the first voltage V1. As described above, the first voltage V1 may include a voltage to be applied to at least one of a selected word line, a selected coupling gate line, a selected erase gate line, and a selected source line. For convenience of description, it is assumed that the first voltage V1 of FIG. 3 is a source line voltage to be applied to a selected source line, and that FIG. 3 will be described with reference to reference numerals/marks of FIG. 2.

During a first time t1, the nonvolatile memory device 100 performs a set-up operation of the address ADDR for the program operation based on the address ADDR and the command CMD. In some embodiments, during the set-up operation of the address ADDR, the control circuit 150 may generate the first control signal CT1 for selecting a word line, a coupling gate line, an erase gate line, and a source line during the first time t1. In some embodiments, during the set-up operation of the address ADDR, the control circuit 150 may generate the second control signal CT2 for selecting a bit line. Also during the first time t1, the nonvolatile memory device 100 may perform a set-up operation of the input data Din to be programmed in the respective main memory areas M1 to Ma.

During a second time t2, the first voltage generator 160 may output the first voltage V1 through the switch 161. During the second time t2, a level of a voltage that is input to the row decoder 120 may reach a level of a source line voltage to be provided to a selected source line.

During a third time t3, the input data Din are programmed in a memory cell connected to the selected source line and the selected bit line. The input data Din may be programmed in parallel in memory cells of the respective main memory areas M1 to Ma. The first voltage V1 may maintain a voltage level reached during at the second time t2. The program operation corresponding to the selected bit line may be performed during a time period including the second time t2 and the third time t3, and the second time t2 and the third time t3 may be defined as a first program time PGM1.

During a fourth time t4, the nonvolatile memory device 100 performs a set-up operation of another address ADDR for the program operation associated with another column. Here, the set-up of the address ADDR may mean a change of a column address, and the fourth time t4 may be defined as the above-described column address switch time. During the fourth time t4, the first voltage V1 may be uniformly maintained at the level of the source line voltage. Previously, where the switch 161 was turned off during the fourth time t4, the level of the first voltage V1 would drop, and a time was needed for the first voltage V1 to again reach the level of the source line voltage. As such, because the fourth time t4 was longer, previous program times were longer. Embodiments of the present inventive concepts may avoid this longer fourth time t4 by maintaining the first voltage V1 at the level of the source line voltage. As such, the nonvolatile memory device 100 according to embodiments of the inventive concepts may support higher-speed program operations.

During the fourth time t4, main bit lines are not selected. Previously, an output path of a current generated due to a difference between the source line voltage and a bit line voltage may have been blocked, and the first voltage V1 may sharply change. According to the present inventive concepts, because a dummy bit line is selected and a current path is formed, the current corresponding to the source line voltage may flow through the dummy bit line. Accordingly, the stability and reliability of program operations using the nonvolatile memory device 100 may be improved.

A bit line targeted for the program operation is changed during the fourth time t4, and the third time t3 for the program operation is again provided. During the third time t3, the input data Din may be programmed in a memory cell connected to the changed bit line, and the third time t3 may be defined as a second program time PGM2. Afterwards, the fourth time t4 being the column address switch time and the third time t3 defined as a third program time PGM3 may be repeated. For convenience of description, in FIG. 3, it is assumed that a column address is changed three times during the word program time.

During a fifth time t5, the switch 161 may be turned off, and the first voltage V1 output from the first voltage generator 160 may be discharged. The fifth time t5 may be provided when a program operation (or a word program operation) corresponding to a selected word line or source line is completed. After the fifth time t5, the address ADDR and the input data Din may be again set up, and the program operation may be performed on memory cells connected to another word line or source line.

Figure 4:
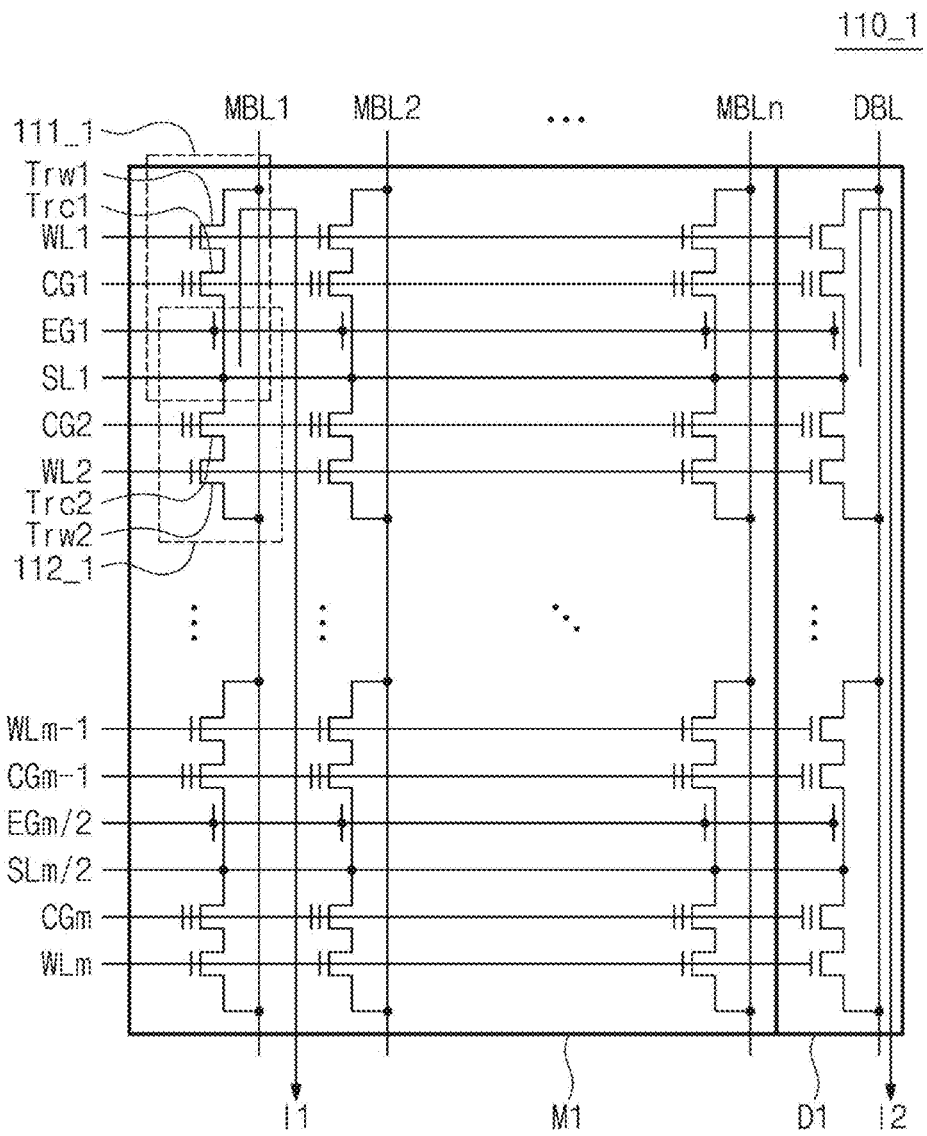
FIG. 4 is an exemplary circuit diagram of a memory cell array of FIGS. 1 and 2.

FIG. 4 is an exemplary circuit diagram of a memory cell array of FIGS. 1 and 2. Referring to FIG. 4, a memory cell array 110_1 may include the main memory area M1 and the dummy memory area D1. For convenience of description, only one main memory area M1 and only one dummy memory area D1 are illustrated in FIG. 4 and described herein, but the present disclosure is not limited thereto.

The memory cell array 110_1 may include a plurality of memory cells formed in a semiconductor substrate. Herein, it is assumed that the number of main memory cells included in the main memory area M1 is "m×n" and the number of dummy memory cells included in the dummy memory area D1 is "m". The main memory cells are connected with main bit lines MBL1 to MBLn, and the dummy memory cells are connected with a dummy bit line DBL.

The bit lines MBL1 to MBLn and DBL, word lines WL1 to WLm, coupling gate lines CG1 to CGm, source lines SL1 to SLm/2, and erase gate lines EG1 to EGm/2 connected with the plurality of memory cells may be formed in the semiconductor substrate. The plurality of memory cells may be connected to different word lines or to different bit lines. That is, the memory cell array 110_1 may be a memory cell array of a NOR flash type.

The memory cell array 110_1 may include a first memory cell 111_1 and a second memory cell 112_1. The first memory cell 111_1 includes a first word line transistor Trw1 and a first cell transistor Trc1. The first memory cell 111_1 is connected with the first word line WL1, the first coupling gate line CG1, the first erase gate line EG1, the first source line SL1, and the first bit line MBL1.

The first word line transistor Trw1 includes a first terminal (or a first end) connected to the first bit line MBL1, a second terminal (or a second end opposite from the first end) connected to the first source line SL1 through the first cell transistor Trc1, and a control terminal connected to the first word line WL1. When a voltage provided to the first word line WL1 is greater than a threshold voltage of the first word line transistor Trw1, the first word line transistor Trw1 may form a channel area between the first terminal and the second terminal. The voltage that is provided to the first word line WL1 may determine a bit line voltage that is applied to the first bit line MBL1. For example, a level of the bit line voltage that is applied to the first bit line MBL1 may correspond to a difference between the voltage of the first word line WL1 and the threshold voltage of the first word line transistor Trw1.

The first cell transistor Trc1 includes a first terminal (or a first end) connected to the first bit line MBL1 through the first word line transistor Trw1, a second terminal (or a second end opposite from the first end) connected to the first source line SL1, and a control terminal connected to the first coupling gate line CG1. Also, the first cell transistor Trc1 further includes a floating gate into which charges are injected in the program operation. In the program operation, hot carriers may be injected into the floating gate of the first cell transistor Trc1 based on the voltage provided to the first coupling gate line CG1. In the following description, it is assumed that the first memory cell 111_1 is a memory cell selected for the program operation.

A potential difference between the voltage provided to the first source line SL1 and the voltage applied to the first bit line MBL1 may cause hot carriers. A first current I1 may be generated based on the hot carriers. The first current I1 may flow from the first memory cell 111_1 to the first bit line MBL1. A level of the voltage applied to the first source line SL1 may be higher than a level of the voltage applied to the first bit line MBL1 such that hot carriers are generated.

A level of a voltage provided to the first erase gate line EG1 adjacent to the first source line SL1 may be the same as a level of the voltage applied to the first source line SL1. The voltage provided to the first coupling gate line CG1 may generate a strong electric field such that hot carriers are injected into the floating gate. Accordingly, a high voltage may be applied to the first coupling gate line CG1.

A program characteristic of the first memory cell 111_1 may be improved as a large amount of hot carriers are generated or as a large amount of hot carriers are injected into the floating gate. If a level of the voltage applied to the first source line SL1 increases, a potential difference between the voltage provided to the first source line SL1 and the voltage applied to the first bit line MBL1 may increase. This may result in an increase in the amount of hot carriers generated. Alternatively, if a level of the voltage applied to the first coupling gate line CG1 increases, the amount of hot carriers injected into the floating gate may increase.

The voltage applied to the first source line SL1 may be applied to other memory cells connected to the first source line SL1. If a level of the voltage applied to the first source line SL1 is excessively high, a large amount of hot carriers may be generated at the other memory cells, and the hot carriers thus generated may be injected into floating gates of the other memory cells. That is, charges may be injected into a floating gate of an unselected memory cell. For example, even though the second memory cell 112_1 sharing the first source line SL1 or a memory cell adjacent to the first memory cell 111_1 in a row direction is not selected, the second memory cell 112_1 or the adjacent memory cell may be programmed erroneously.

As described above, the dummy bit line DBL may be selected during the column address switch time. If a level of the voltage applied to the first source line SL1 is uniformly maintained with a bit line not selected, or with no bit line selected, a current path may be blocked, and the level of the voltage applied to the first source line SL1 may sharply increase. In this case, other adjacent memory cells may be programmed as described above. To prevent a voltage level of a source line from increasing, the dummy bit line DBL may be selected such that a second current I2 flows during the column address switch time. A level of the voltage applied to the first source line SL1 may be prevented from sharply increasing through the dummy bit line DBL and the dummy memory area D1, and thus, a program error may decrease.

The second memory cell 112_1 includes a second word line transistor Trw2 and a second cell transistor Trc2. The second word line transistor Trw2 includes a first terminal (or a first end) connected to the first bit line MBL1, a second terminal (or a second end opposite from the first end) connected to the first source line SL1 through the second cell transistor Trc2, and a control terminal connected to a second word line WL2. The second cell transistor Trc2 includes a first terminal (or a first end) connected to the first bit line MBL1 through the second word line transistor Trw2, a second terminal (or a second end opposite from the first end) connected to the first source line SL1, and a control terminal connected to a second coupling gate line CG2.

The second memory cell 112_1 may be connected with the second word line WL2, the second coupling gate line CG2, the first erase gate line EG1, the first source line SL1, and the first bit line MBL1. The second memory cell 112_1 may share the first erase gate line EG1 and the first source line SL1 with the first memory cell 111_1. The second memory cell 112_1 may be arranged adjacent to the first memory cell 111_1 in a column direction. The first memory cell 111_1 and the second memory cell 112_1 have the same structure, and thus, further description of the second memory cell 112_1 will be omitted to avoid redundancy.

Figure 5:
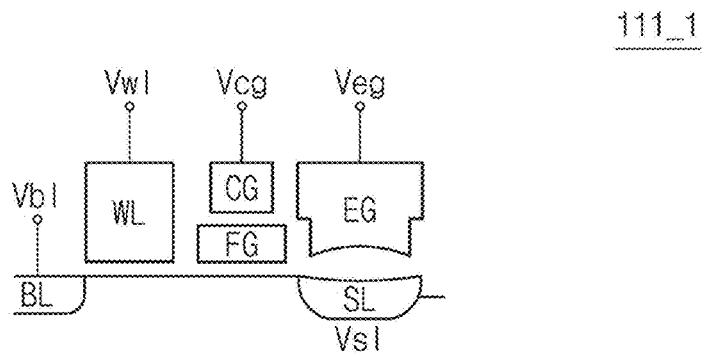
FIG. 5 is a cross-sectional view of a first memory cell of FIG. 4.

FIG. 5 is a cross-sectional view of a first memory cell of FIG. 4. Referring to FIG. 5, the first memory cell 111_1 may include a bit line connection (or junction) area BL, a word line connection area WL, a source line connection area SL, a coupling gate CG, a floating gate FG, and an erase gate EG. For convenience of description, FIG. 5 will be described with reference to reference numerals/marks of FIG. 4.

The bit line connection area BL and the source line connection area SL may be formed in a semiconductor substrate. For example, the semiconductor substrate may be a P-type semiconductor substrate. Each of the bit line connection area BL and the source line connection area SL may be an N-doped area of the semiconductor substrate. The bit line connection area BL may be connected with the first bit line MBL1. A bit line voltage Vbl may be applied to the bit line connection area BL. The source line connection area SL may be connected with the first source line SL1. A source line voltage Vsl may be applied to the source line connection area SL. A channel area is formed between the bit line connection area BL and the source line connection area SL. Electrons may move in the channel area. During the program operation, electrons may move from the bit line connection area BL to the source line connection area SL.

The word line connection area WL may be formed over the channel area. An insulating layer may be formed between the word line connection area WL and the semiconductor substrate. The word line connection area WL may be connected with the first word line WL1. A word line voltage Vwl may be applied to the word line connection area WL. The word line connection area WL may control an electron transfer or a current flow between the source line connection area SL and the bit line connection area BL.

The bit line connection area BL, the source line connection area SL, and the word line connection area WL may form the first word line transistor Trw1. When a level of the word line voltage Vwl exceeds a level of the threshold voltage of the first word line transistor Trw1, electrons may move in the channel area. In the program operation, a difference between the word line voltage Vwl and the threshold voltage may be the bit line voltage Vbl.

The floating gate FG may be formed over the channel area so as not to overlap the word line connection area WL in a plan view. An insulating layer may be formed between the floating gate FG and the semiconductor substrate. During the program operation, electrons that move from the bit line connection area BL to the source line connection area SL are injected into the floating gate FG.

The coupling gate CG may be formed over the floating gate FG. An insulating layer may be formed between the coupling gate CG and the floating gate FG. The coupling gate CG may be connected with the first coupling gate line CG1. A coupling gate voltage Vcg may be applied to the coupling gate CG. In the program operation, as an electric field is formed between the coupling gate CG and the semiconductor substrate by the coupling gate voltage Vcg, electrons moving in the channel area may be injected into the floating gate FG. The bit line connection area BL, the source line connection area SL, the floating gate FG, and the coupling gate CG may form the first cell transistor Trc1.

The erase gate EG may be formed over the source line connection area SL. An insulating layer may be formed between the erase gate EG and the source line connection area SL. The erase gate EG is disposed adjacent to the floating gate FG. The erase gate EG may be connected with the first erase gate line EG1. An erase gate voltage Veg is applied to the erase gate EG. In an erase operation, as an electric field is formed between the erase gate EG and the floating gate FG by the erase gate voltage Veg, electrons injected into the floating gate FG may be tunneled into the erase gate EG.

A memory cell sharing a source line with a selected memory cell may share a word line, a coupling gate line, and an erase gate line. Accordingly, the source line voltage Vsl, the word line voltage Vwl, the coupling gate voltage Vcg, and the erase gate voltage Veg that are applied to the selected memory cell may be also applied to a memory cell connected with an unselected bit line and the selected source line.

In the case where a level of a voltage applied to the source line connection area SL is excessively high, a channel area may be formed at other memory cells sharing a source line with the first memory cell 111_1. Even though a suppression voltage is applied to prevent channels from being formed at memory cells connected to unselected bit lines, in the case where the source line voltage Vsl exceeds a threshold, a channel may be formed. As such, electrons may be injected into floating gates of the other memory cells. As described above, the dummy memory area D1 may form a current path during the column address switch time, thus suppressing a sharp increase of the source line voltage Vsl.

Figure 6:
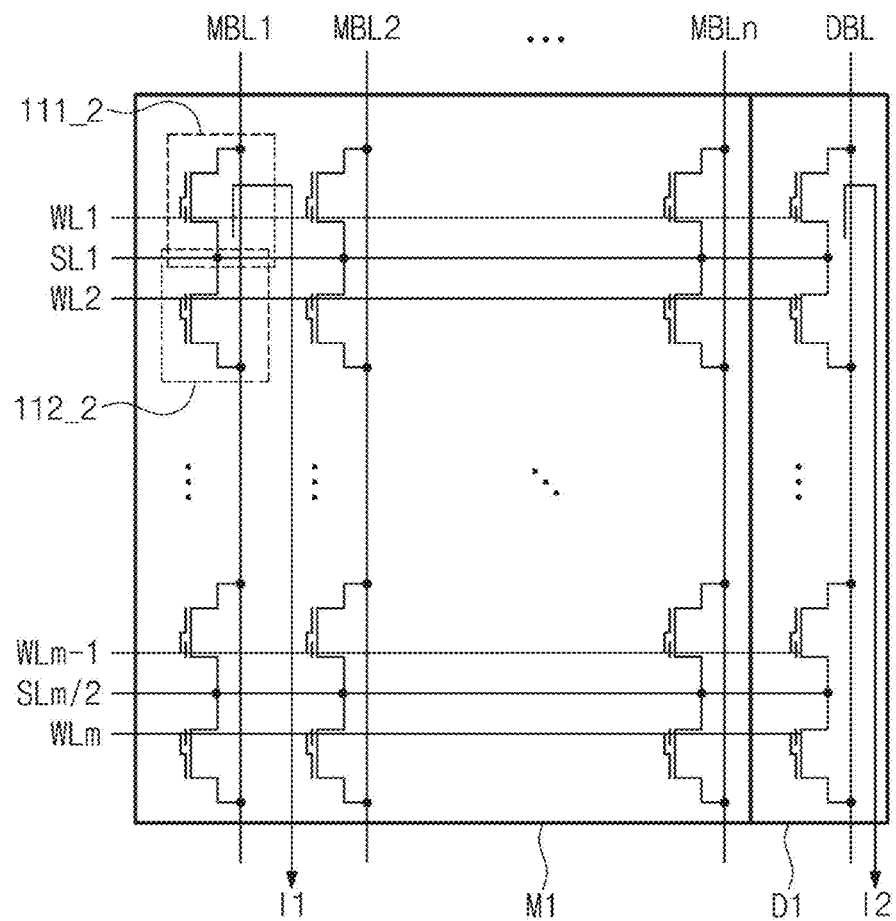
FIG. 6 is an exemplary circuit diagram of a memory cell array of FIGS. 1 and 2.

FIG. 6 is an exemplary circuit diagram of a memory cell array of FIGS. 1 and 2. Referring to FIG. 6, a memory cell array 110_2 may include the main memory area M1 and the dummy memory area D1. For convenience of description, only one main memory area M1 and only one dummy memory area D1 are illustrated in FIG. 6 and described herein, although the present disclosure is not limited thereto. Main memory cells of the main memory area M1 are connected with the main bit lines MBL1 to MBLn, and dummy memory cells of the dummy memory area D1 are connected with the dummy bit line DBL.

The memory cell array 110_2 may include a plurality of memory cells formed in a semiconductor substrate. The bit lines MBL1 to MBLn and DBL, the word lines WL1 to WLm, and the source lines SL1 to SLm/2 connected with the plurality of memory cells may be formed in the semiconductor substrate. The memory cell array 110_2 may be a memory cell array of a NOR flash type different from that illustrated in FIG. 4. In this case, coupling gate lines and erase gate lines may not be separately formed, and thus in some embodiments the nonvolatile memory device 100 of FIGS. 1 and 2 may not include the coupling gate lines CG and the erase gate lines EG.

The memory cell array 110_2 may include a first memory cell 111_2 and a second memory cell 112_2. The first memory cell 111_2 is connected with the first word line WL1, the first source line SL1, and the first bit line MBL1. The second memory cell 112_2 is connected with the second word line WL2, the first source line SL1, and the first bit line MBL1.

The first memory cell 111_2 may form a channel area when a voltage provided to the first word line WL1 is greater than a threshold voltage thereof. A potential difference between the voltage provided to the first source line SL1 and the voltage applied to the first bit line MBL1 may cause hot carriers. The first current I1 is generated based on the hot carriers. The first current I1 may flow from the first memory cell 111_2 to the first bit line MBL1. During the program operation, hot carriers may be injected into a floating gate of the first memory cell 111_2 based on the voltage provided to the first word line WL1.

The voltage applied to the first source line SL1 may be applied to other memory cells connected to the first source line SL1. If a level of the voltage applied to the first source line SL1 is excessively high, a large amount of hot carriers may be generated at the other memory cells, and the hot carriers thus generated may be injected into floating gates of the other memory cells. For example, even though the second memory cell 112_2 sharing the first source line SL1 or a memory cell adjacent to the first memory cell 111_2 in a row direction is not selected, the second memory cell 112_2 or the adjacent memory cell may be programmed erroneously.

As described above, the dummy bit line DBL is selected during the column address switch time such that the second current I2 flows. A level of the voltage applied to the first source line SL1 may be prevented from sharply increasing through the dummy bit line DBL and the dummy memory area D1, and thus, a program error may decrease.

Figure 7:
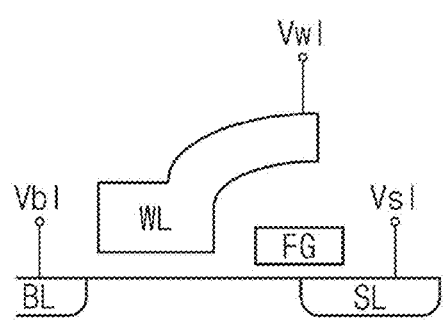
FIG. 7 is a cross-sectional view of a first memory cell of FIG. 6.

FIG. 7 is a cross-sectional view of a first memory cell of FIG. 6. Referring to FIG. 7, the first memory cell 111_2 includes the bit line connection area BL, the word line connection area WL, the source line connection area SL, and the floating gate FG. For convenience of description, FIG. 7 will be described with reference to reference numerals/marks of FIG. 6.

The bit line connection area BL and the source line connection area SL may be formed in a semiconductor substrate. The bit line connection area BL may be connected with the first bit line MBL1. The bit line voltage Vbl may be applied to the bit line connection area BL. The source line connection area SL may be connected with the first source line SL1. The source line voltage Vsl may be applied to the source line connection area SL. A channel area may be formed between the bit line connection area BL and the source line connection area SL. During the program operation, electrons may move from the bit line connection area BL to the source line connection area SL.

The word line connection area WL may be formed over the channel area and the floating gate FG. An insulating layer may be formed between the word line connection area WL and the semiconductor substrate. The word line connection area WL may be connected with the first word line WL1. The word line voltage Vwl may be applied to the word line connection area WL. The word line connection area WL may control an electron transfer or a current flow between the source line connection area SL and the bit line connection area BL.

The floating gate FG may be formed between the word line connection area WL and the channel area. An insulating layer may be formed between the floating gate FG and the semiconductor substrate. During the program operation, electrons that move from the bit line connection area BL to the source line connection area SL may be injected into the floating gate FG. Also, an insulating layer may be formed between the word line connection area WL and the floating gate FG. During the program operation, as an electric field is formed between the word line connection area WL and the semiconductor substrate by the word line voltage Vwl, electrons moving in the channel area may be injected into the floating gate FG.

If a level of a voltage applied to the source line connection area SL is excessively high, a channel area may be formed at other memory cells sharing a source line with the first memory cell 111_2. Even though a suppression voltage may be applied to prevent channels from being formed at memory cells connected to unselected bit lines, in the case where the source line voltage Vsl is excessively great, a channel may be formed. As such, electrons may be injected into floating gates of the other memory cells. As described above, the dummy memory area D1 may form a current path during the column address switch time, thus suppressing a sharp increase of the source line voltage Vsl.

Figure 8:
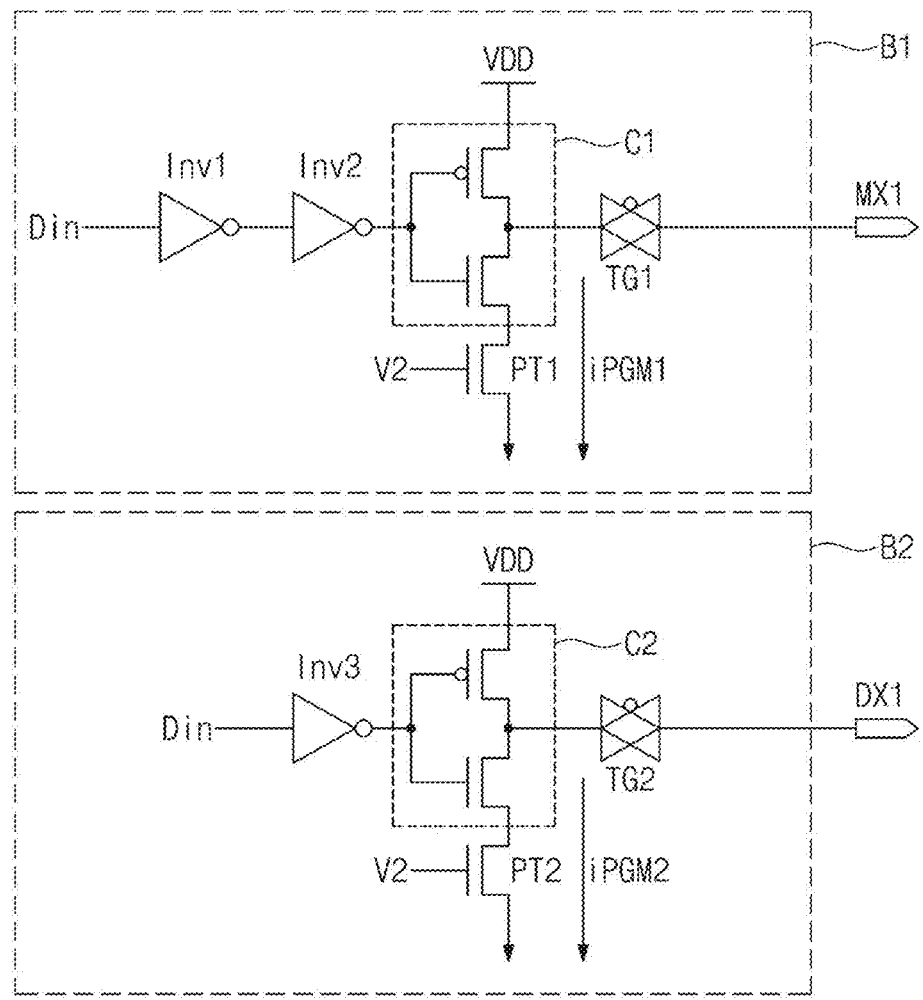
FIG. 8 is an exemplary circuit diagram of a program buffer of FIG. 2.

FIG. 8 is an exemplary circuit diagram of a program buffer of FIG. 2. The program buffer PB1 of FIG. 8 may be one of the plurality of program buffers PB1 to PBa of FIG. 2. The program buffer PB1 illustrated in FIG. 8 may be understood as one example embodiment for forming a current path during the column address switch time, and the program buffer PB1 of the inventive concepts is not limited to the example illustrated in FIG. 8. Referring to FIG. 8, the program buffer PB1 may include a first data buffer B1 and a second data buffer B2.

The first data buffer B1 may include first inverters Inv1 and Inv2, a first data conversion circuit C1, a first transmission gate TG1, and a first operation transistor PT1. The first data buffer B1 may be connected with the main selection circuit MX1 of FIG. 2 through a data line. During the program operation, the first data buffer B1 operates in response to a first value of the input data Din such that a first program current iPGM1 flows through the data line. Here, the first program current iPGM1 may correspond to the first current I1 of FIGS. 4 and 6.

The input data Din may have a first value (0 or 1) or a second value (1 or 0) as a binary value. When the first value is input to the first inverters Inv1 and Inv2, the first value may be output to the first data conversion circuit C1. When the second value is input to the first inverters Inv1 and Inv2, the second value may be output to the first data conversion circuit C1.

The first data conversion circuit C1 may provide the supply voltage VDD or a ground voltage to the data line based on a value of the input data Din. The first data conversion circuit C1 may include a CMOS inverter. The CMOS inverter may include a PMOS transistor and an NMOS transistor receiving the input data Din. The PMOS transistor may include a first terminal configured to receive the supply voltage VDD, a second terminal connected with the first transmission gate TG1, and a control terminal configured to receive the input data Din. The NMOS transistor may include a first terminal connected with the first transmission gate TG1, a second terminal connected with the first operation transistor PT1, and a control terminal configured to receive the input data Din.

The transmission gate TG1 may control a current flowing from the data line in a program operation. For example, when the first data conversion circuit C1 receives the first value, the ground voltage may be provided to the data line, and the first program current iPGM1 may flow from the data line through the first transmission gate TG1. In this case, the first value may be programmed in a main memory area. For example, when the first data conversion circuit C1 receives the second value, the supply voltage VDD may be provided to the data line, and the first program current iPGM1 may not flow from the data line through the first transmission gate TG1. In this case, the second value may be programmed in a main memory area.

The first operation transistor PT1 includes a first terminal connected with the first data conversion circuit C1, a second terminal grounded, and a control terminal configured to receive the second voltage V2. The second voltage V2 corresponds to the second voltage V2 generated from the second voltage generator 170 of FIGS. 1 and 2. The second voltage V2 may be provided during the program operation. The first operation transistor PT1 may allow the first program current iPGM1 to flow through the data line based on the second voltage V2.

The second data buffer B2 may include a second inverter Inv3, a second data conversion circuit C2, a second transmission gate TG2, and a second operation transistor PT2. The second data buffer B2 may be connected with the dummy selection circuit DX1 of FIG. 2 through a dummy data line. During the program operation, the second data buffer B2 may operate in response to the second value of the input data Din such that a second program current iPGM2 flows through the data line. Here, the second program current iPGM2 may correspond to the second current I2 of FIGS. 4 and 6.

When the second value is input to the second inverter Inv3, the first value may be output to the second data conversion circuit C2. That is, the second value may be inverted to the first value. The input data Din has the second value during the column address switch time. When the second value is input to the first data buffer B1, the first program current iPGM1 is not generated. In contrast, when the second value is applied to the second data buffer B2, the second program current iPGM2 may flow from the dummy selection circuit DX1 through the dummy data line. That is, during the column address switch time, a current path may be formed through the second data buffer B2, the dummy data line, and the dummy selection circuit DX1. Accordingly, an error of a program operation may decrease.

Figure 9:
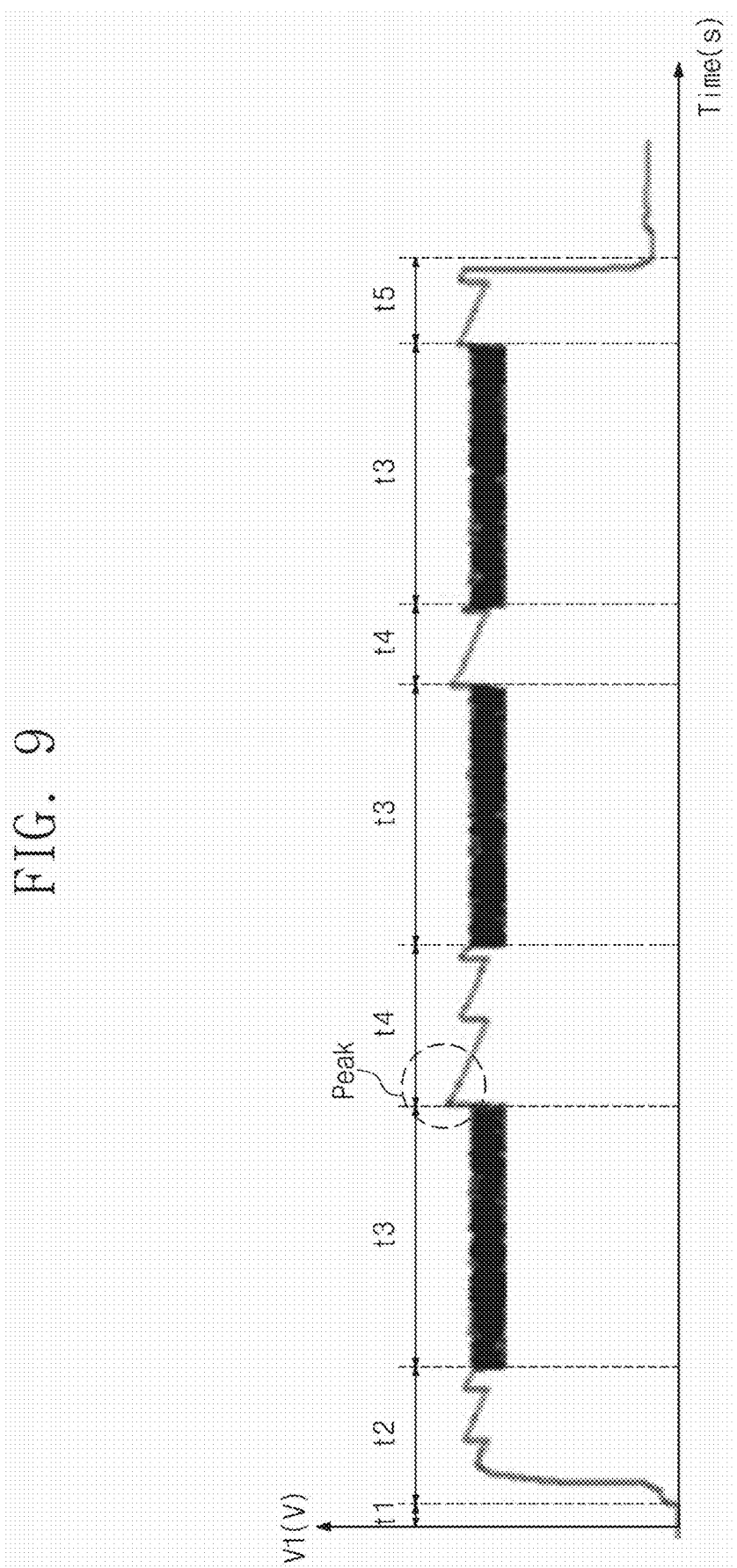
FIG. 9 is a graph illustrating a source line voltage when a dummy memory area according to the inventive concepts is not provided.
Figure 10:
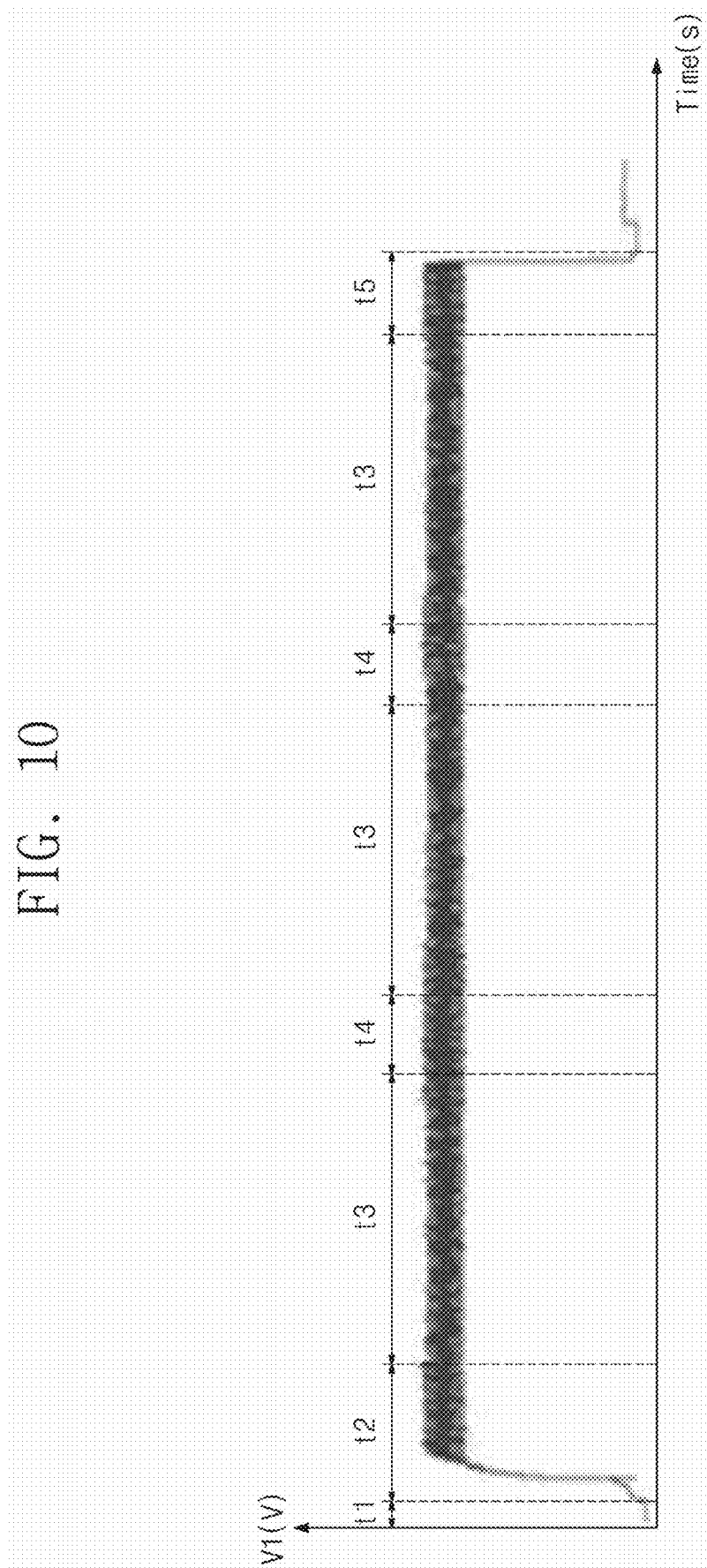
FIG. 10 is a graph illustrating a source line voltage according to some embodiments of the inventive concepts.

FIG. 9 is a graph illustrating a source line voltage when a dummy memory area of the inventive concept is not provided. FIG. 10 is a graph illustrating a source line voltage according to an embodiment of the inventive concept. In FIGS. 9 and 10, the horizontal axes represent time, and the vertical axes represent a level of a source line voltage of the first voltage V1 described with reference to FIGS. 1 and 2. In FIGS. 9 and 10, the first to fifth times t1 to t5 correspond to the first to fifth times t1 to t5 of FIG. 3, respectively.

Referring to FIG. 9, during the third time t3, a program operation associated with a selected word line may be performed based on a source line voltage. During the third time t3, the program operation may be performed based on a potential difference between a selected source line and a selected bit line. During the fourth time t4, the source line voltage may continue to be provided to the memory cell array 110.

The fourth time t4 is the column address switch time when there is changed a bit line targeted for the program operation. Any bit line may not be selected during the column address switch time. In this case, as described with reference to FIGS. 4 and 6, because the first current I1 does not flow instantly, the source line voltage may sharply increase. This voltage increase appears as a peak in FIG. 9. As described above, the increase in the source line voltage may cause the programming of other memory cells.

Referring to FIG. 10, during the third time t3 and the fourth time t4, the source line voltage has a uniform variation. The reason is that a current path may be formed by selecting a dummy bit line during the column address switch time. Accordingly, a sharp increase in the source line voltage may be suppressed. As such, a potential difference between the source line voltage and the suppression voltage applied to an unselected bit line may be maintained to be smaller than a reference voltage causing a program operation, thus decreasing a program error.

Figure 11:
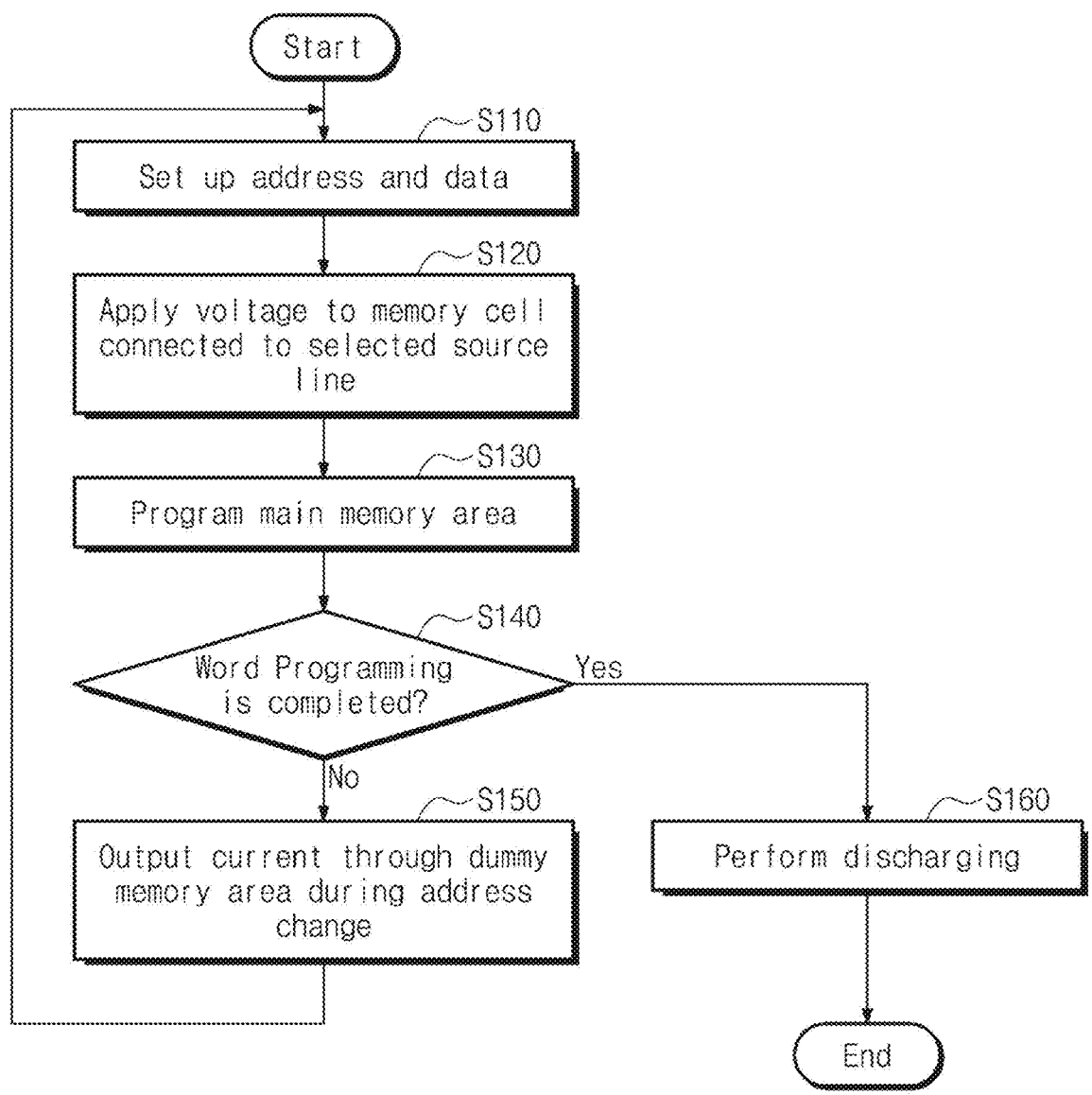
FIG. 11 is a flowchart illustrating an operating method of a nonvolatile memory device according to some embodiments of the inventive concepts.

FIG. 11 is a flowchart illustrating an example of an operating method of a nonvolatile memory device according to some embodiments of the inventive concepts. Referring to FIG. 11, the operating method of a nonvolatile memory device shown therein may be performed in the nonvolatile memory device 100 of FIGS. 1 and 2. For convenience of description, the flowchart of FIG. 11 will be described with reference to reference numerals/marks of FIG. 2.

In operation S110, the nonvolatile memory device 100 may set up the address ADDR and the data "DATA" for the program operation. For example, the control circuit 150 may generate the first control signal CT1 for selecting a word line, a coupling gate line, an erase gate line, and a source line. For example, the control circuit 150 may generate the second control signal CT2 for selecting a bit line.

In operation S120, the nonvolatile memory device 100 may apply the first voltage V1 to main memory cells connected with the selected source line and the selected word line. The first voltage generator 160 may output the first voltage V1 corresponding to a source line voltage to the row decoder 120 through the switch 161. The row decoder 120 may apply the source line voltage to the selected source line. The source line voltage may be applied continuously during the program operation associated with the selected word line.

In operation S130, the nonvolatile memory device 100 may perform the program operation on the plurality of main memory areas M1 to Ma. The input data Din may be programmed in memory cells connected to selected bit lines and the selected word line. The input data Din may be programmed in parallel in the plurality of main memory areas M1 to Ma.

In operation S140, the nonvolatile memory device 100 may determine whether the program operation corresponding to the selected word line is completed. If it is determined that the program operation corresponding to the selected word line is not completed ("No" branch from operation S140), the method proceeds to operation S150, in which a column address is changed such that other bit lines may be selected for the program operation. When it is determined that the program operation corresponding to the selected word line is completed ("Yes" branch from operation S140), that is, when the word program time passes, the process proceeds to operation S160.

In operation S150, the column address switch time for changing bit lines targeted for the program operation progresses. The nonvolatile memory device 100 may output currents through the plurality of dummy memory areas D1 to Da during the column address switch time. To this end, dummy bit lines are selected. A current path may be formed through the selected dummy bit lines, and thus, a sharp increase of the source line voltage may be suppressed. Afterwards, the process proceeds to operation S110, and memory cells connected to the bit lines selected in operation S150 may be programmed.

In operation S160, the nonvolatile memory device 100 may perform a discharge operation on the source line voltage. The first voltage generator 160 discontinues outputting the source line voltage to the row decoder 120. A set-up operation for a program operation of memory cells connected to another row, that is, another word line or source line, may be performed.

Figure 12:
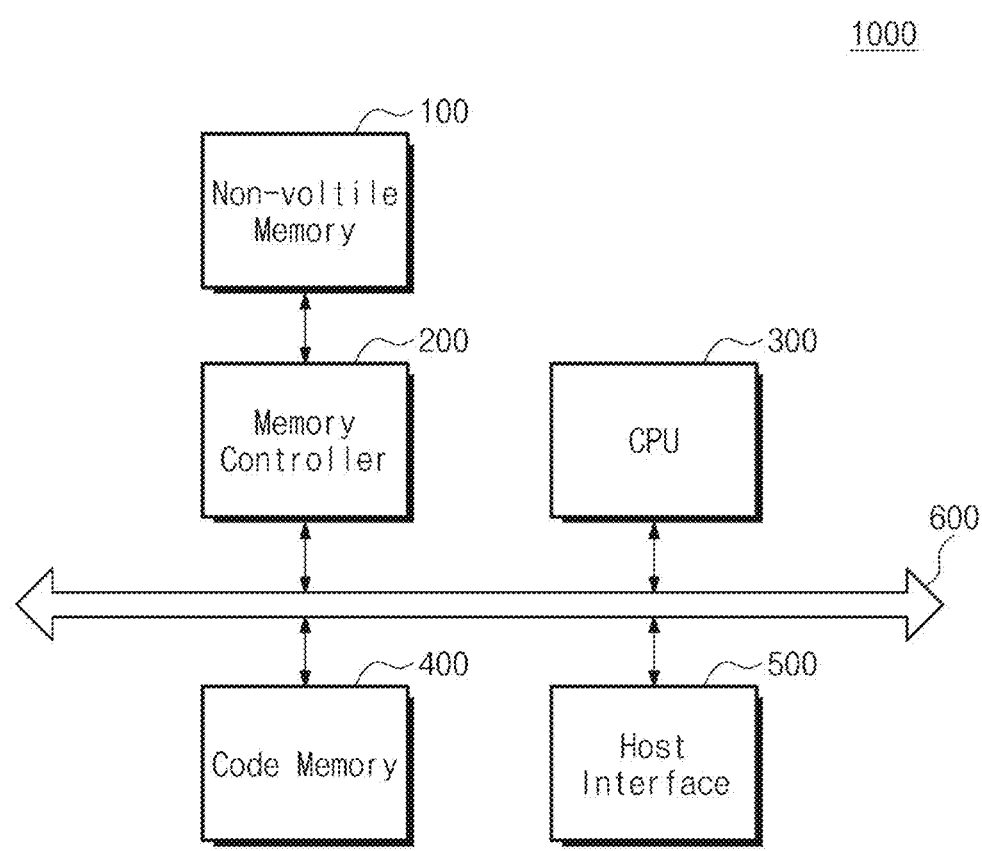
FIG. 12 is an exemplary block diagram of a memory system including a nonvolatile memory device of FIGS. 1 and 2.

FIG. 12 is an exemplary block diagram of a memory system including a nonvolatile memory device of FIGS. 1 and 2. Referring to FIG. 12, a memory system 1000 may include the nonvolatile memory device 100, a memory controller 200, a central processing unit (CPU) 300, a code memory 400, a host interface 500, and a bus 600. The memory system 1000 of FIG. 12 may be an embedded memory system in which logic circuits for accessing the nonvolatile memory device 100 are integrated in a single chip.

The memory controller 200 controls the nonvolatile memory device 100. The memory controller 200 may receive a program command and may control the nonvolatile memory device 100 such that data are stored in the nonvolatile memory device 100. Also, the memory controller 200 may receive a read command and may control the nonvolatile memory device 100 such that a read operation is performed. The memory controller 200 may receive an erase command and may control the nonvolatile memory device 100 such that an erase operation is performed.

The central processing unit 300 may control overall operations of the memory system 1000. For example, the central processing unit 300 may generate a command for performing the program operation, the read operation, or the erase operation in response to an external request. Also, the central processing unit 300 may control each component of the memory system 1000 such that various operations are performed.

The code memory 400 may store a variety of code information for accessing the nonvolatile memory device 100 or driving the nonvolatile memory device 100. The central processing unit 300 may control the nonvolatile memory device 100 and the memory controller 200 based on the code information stored in the code memory 400.

The host interface 500 provides an interface between a host (not illustrated) and the memory system 1000. The host interface 500 may communicate with the host (not illustrated) by using a universal serial bus (USB), a small computer small interface (SCSI), a PCI express, an ATA, a parallel ATA (PATA), a serial ATA (SATA), a serial attached SCSI (SAS), etc.

The bus 600 may provide a communication path between the memory controller 200, the central processing unit 300, the code memory 400, and the host interface 500 of the memory system 1000. The respective components of the memory system 1000 may exchange information with each other through the bus 600.

Nonvolatile memory devices and operating methods thereof according to embodiments of the inventive concepts may provide a high voltage to a memory cell array continuously, even during a column address switch time, thus improving a speed at which a program operation is performed.

Also, nonvolatile memory devices and operating methods according to embodiments of the inventive concepts may form current paths during the column address switch time by using a dummy memory area, thus decreasing a program error due to the high voltage that is being continuously provided during the column address switch time.

Although the inventive concepts have been described with reference to examples of embodiments thereof, it will be apparent to those of ordinary skill in the art that various changes and modifications may be made thereto without departing from the scope of the inventive concepts as set forth in the following claims.

What is claimed is:
1. A nonvolatile memory device comprising:
a memory cell array including a main memory area and a dummy memory area, wherein the main memory area is connected to a plurality of main bit lines and the dummy memory area is connected to a dummy bit line;
a row decoder connected to the memory cell array through a plurality of word lines and a plurality of source lines;

a bit line selection circuit configured to select at least one main bit line of the plurality of main bit lines during a program time and configured to select the dummy bit line during a column address switch time that occurs after the program time;
a data input/output circuit connected to the bit line selection circuit through a plurality of data lines;
a control circuit configured to control the row decoder and the bit line selection circuit based on an address and a command; and
a voltage generator configured to output, to the row decoder, a source line voltage to be applied to a source line selected from the plurality of source lines during the program time and during the column address switch time,
wherein a voltage level of the source line voltage during the program time equals a voltage level of the source line voltage during the column address switch time.

2. The nonvolatile memory device of claim 1, wherein the bit line selection circuit includes:
a main selection circuit configured to transfer a current from the at least one main bit line to the data input/output circuit during the program time; and
a dummy selection circuit configured to transfer a current from the dummy bit line to the data input/output circuit during the column address switch time.

3. The nonvolatile memory device of claim 2, wherein the main selection circuit is connected to a first data line of the plurality of data lines and to the plurality of main bit lines, and
wherein the dummy selection circuit is connected to a second data line of the plurality of data lines and to the dummy bit line.

4. The nonvolatile memory device of claim 2, wherein the dummy selection circuit is configured to transfer the current from the dummy bit line to the data input/output circuit based on a value of input data.

5. The nonvolatile memory device of claim 1, wherein the data input/output circuit includes:
a first data buffer connected to a first data line of the plurality of data lines and configured to pass a current from the at least one main bit line and the first data line, based on a first value of input data; and
a second data buffer connected to a second data line of the plurality of data lines and configured to pass a current from the dummy bit line and the second data line, based on a second value of the input data.

6. The nonvolatile memory device of claim 5, wherein the first data buffer and the second data buffer are configured to receive the second value during the column address switch time.

7. The nonvolatile memory device of claim 5, wherein the first data buffer is configured to provide a ground voltage to the first data line and the at least one main bit line in response to the first value, and wherein the second data buffer is configured to invert the first value to the second value and to provide a supply voltage to the second data line and the dummy bit line in response to the second value.

8. The nonvolatile memory device of claim 5, wherein the first data buffer is configured to provide a supply voltage to the first data line and the at least one main bit line in response to the second value, and wherein the second data buffer is configured to invert the second value to the first value and provides a ground voltage to the second data line and the dummy bit line in response to the first value.

9. The nonvolatile memory device of claim 1, wherein the voltage generator is configured to output the source line voltage to the row decoder during a word program time in which memory cells connected to a first word line selected from the plurality of word lines in the main memory area are programmed, wherein the word program time includes the program time and the column address switch time.

10. The nonvolatile memory device of claim 9, wherein the voltage generator includes a switch configured to turn on during the word program time to transfer the source line voltage to the row decoder, and configured to turn off during a row address switch time after the word program time in which a second word line from the plurality of word lines in the main memory area is to be selected.

11. A nonvolatile memory device comprising:
a memory cell array including a plurality of main memory areas and a plurality of dummy memory areas alternately arranged in a direction in which a plurality of word lines and a plurality of source lines extend;
a row decoder connected to the memory cell array through the plurality of word lines and the plurality of source lines;
a bit line selection circuit including a plurality of main selection circuits each connected to a respective main memory area through main bit lines, the bit line selection circuit further including a plurality of dummy selection circuits each connected to a respective dummy memory area through a dummy bit line;
a data input/output circuit configured to pass a current transferred from the main selection circuits based on a first value of input data and to pass a current transferred from the dummy selection circuits based on a second value of the input data; and
a voltage generator configured to maintain a word line voltage and a source line voltage at a voltage level while a program operation is performed on a word line selected from the plurality of word lines.

12. The nonvolatile memory device of claim 11, wherein, during a program time of the main memory areas, the main selection circuits are configured to select at least one of the main bit lines connected thereto, and wherein, during a column address switch time in which at least one other main bit line connected to each main memory area are selected, the dummy selection circuits are configured to select the dummy bit lines.

13. The nonvolatile memory device of claim 12, wherein the second value of the input data is provided to the data input/output circuit during the column address switch time.

14. The nonvolatile memory device of claim 12, wherein the nonvolatile memory device is configured to transfer a current generated based on the source line voltage during the column address switch time to the data input/output circuit through the dummy memory areas.

15. The nonvolatile memory device of claim 11, wherein the row decoder is connected to the memory cell array through a plurality of coupling gate lines in addition to the plurality of word lines and the plurality of source lines, and wherein the memory cell array is configured to program the input data based on a potential difference between a selected source line and a selected bit line and a voltage of a selected coupling gate line.

16. The nonvolatile memory device of claim 11, wherein the memory cell array is configured to program the input data based on a potential difference between a selected source line and a selected bit line and a voltage of the selected word line.

17. The nonvolatile memory device of claim 11, wherein the memory cell array is configured to program the input data by injecting charges, which move based on a potential difference between a selected source line and a selected bit line, into a floating gate in the memory cell array.

18. A method of operating a nonvolatile memory device, comprising:
- outputting a word line voltage and a source line voltage to a row decoder;
- applying the word line voltage and the source line voltage to a selected word line and a selected source line, respectively;
- selecting a first bit line based on a first address;
- performing a program operation on a main memory cell connected to the selected word line, the selected source line, and the first bit line;
- selecting a dummy bit line during a column address switch time in which a second bit line is selected based on a second address; and
- sinking a current generated based on the source line voltage through the dummy bit line during the column address switch time.

19. The operating method of claim 18, wherein, during the column address switch time, the source line voltage is transferred to the selected source line.

20. The operating method of claim 18, wherein the selecting of the dummy bit line includes releasing the selecting of the first bit line, and wherein the sinking of the current through the dummy bit line includes:
- receiving, by a data input/output circuit of the nonvolatile memory device, input data during the column address switch time; and
- providing a ground voltage to the dummy bit line in response to the input data.

* * * * *